(12) United States Patent
Latunski (10) Patent No.: US 9,077,098 B2
(45) Date of Patent: Jul. 7, 2015

(54) ELECTRICAL CONNECTOR WITH SEALED PINS

(71) Applicant: MAGNA ELECTRONICS INC., Auburn Hills, MI (US)

(72) Inventor: Paul D. Latunski, Morrice, MI (US)

(73) Assignee: MAGNA ELECTRONICS INC., Auburn Hills, MI (US)

( * ) Notice: Subject to any disclaimer, the term of this patent is extended or adjusted under 35 U.S.C. 154(b) by 0 days.

(21) Appl. No.: 13/916,051

(22) Filed: Jun. 12, 2013

(65) Prior Publication Data

US 2013/0344736 A1   Dec. 26, 2013

Related U.S. Application Data

(60) Provisional application No. 61/659,741, filed on Jun. 14, 2012.

(51) Int. Cl.
| | |
|---|---|
| *H01R 12/00* | (2006.01) |
| *H01R 13/52* | (2006.01) |
| *H01R 43/00* | (2006.01) |
| *F02D 41/00* | (2006.01) |

(52) U.S. Cl.
CPC ............ *H01R 13/521* (2013.01); *H01R 43/005* (2013.01); *Y10T 29/49147* (2015.01); *H01R 2201/26* (2013.01); *F02D 41/00* (2013.01); *F02D 2400/22* (2013.01)

(58) Field of Classification Search
CPC ............. H01R 13/6658; H01R 13/658; H01R 23/025; H01R 23/7068; H01R 31/06; H01R 13/5208; H01R 13/5205; H01R 13/5221; H01R 13/521; H01R 13/5219
USPC ............... 439/76.1, 79, 936; 174/76; 361/752
See application file for complete search history.

(56) References Cited

U.S. PATENT DOCUMENTS

| | | | | | |
|---|---|---|---|---|---|
| 1,975,147 | A | * | 10/1934 | Hartdorn | 123/179.31 |
| 2,231,212 | A | * | 2/1941 | Miller | 431/68 |
| 2,585,278 | A | * | 2/1952 | Shivers | 361/161 |
| 2,804,856 | A | * | 9/1957 | Spurlin | 123/46 R |
| 3,132,803 | A | * | 5/1964 | Wantz et al. | 236/68 D |
| 3,367,571 | A | * | 2/1968 | Wantz et al. | 236/68 D |
| 3,744,128 | A | * | 7/1973 | Fisher et al. | 29/858 |
| 4,596,428 | A | * | 6/1986 | Tengler | 439/95 |
| 4,811,165 | A | * | 3/1989 | Currier et al. | 361/716 |
| 4,900,271 | A | * | 2/1990 | Colleran et al. | 439/595 |
| 5,189,782 | A | * | 3/1993 | Hickey | 29/602.1 |
| 5,630,732 | A | * | 5/1997 | Yamanashi | 439/589 |
| 5,703,754 | A | * | 12/1997 | Hinze | 361/736 |
| 5,752,812 | A | * | 5/1998 | Brown | 417/422 |
| 5,820,739 | A | * | 10/1998 | Graser et al. | 204/421 |
| 5,836,789 | A | * | 11/1998 | Kourimsky et al. | 439/604 |

(Continued)

*Primary Examiner* — Abdullah Riyami
*Assistant Examiner* — Vladimir Imas
(74) *Attorney, Agent, or Firm* — Gardner, Linn, Burkhart & Flory, LLP (57) ABSTRACT

An electrical accessory for a vehicle includes a housing having a connector portion having a connector cavity therein, and a plurality of terminals that electrically connect at a circuit element in the housing and that protrude at least partially into the connector cavity. The housing has at least one fill port and at least one channel for receiving a sealant material through the fill port, whereby the sealant material flows along the at least one channel and at and around at least one terminal to substantially seal the at least one terminal relative to the housing. The fill port is accessible from outside of the housing after the electrical accessory is assembled.

20 Claims, 8 Drawing Sheets

(56) References Cited

U.S. PATENT DOCUMENTS

| | | | |
|---|---|---|---|
| 6,431,884 B1* | 8/2002 | Wallace et al. | 439/86 |
| 6,552,911 B1* | 4/2003 | Haupt et al. | 361/752 |
| 6,664,678 B2* | 12/2003 | Shimizu | 310/71 |
| 6,769,315 B2* | 8/2004 | Stevenson et al. | 73/862.629 |
| 6,877,488 B2* | 4/2005 | Washeleski et al. | 123/497 |
| 6,964,575 B1* | 11/2005 | Sailor | 439/76.1 |
| 7,217,157 B2* | 5/2007 | Onoda et al. | 439/589 |
| 7,238,036 B2* | 7/2007 | Sato et al. | 439/236 |
| 7,255,837 B2* | 8/2007 | Abe et al. | 73/204.22 |
| 7,355,857 B2* | 4/2008 | Pirillis et al. | 361/715 |
| 7,377,808 B2* | 5/2008 | Gentry | 439/578 |
| 7,475,954 B1* | 1/2009 | Latunski | 312/297 |
| 7,679,923 B2* | 3/2010 | Inagaki et al. | 361/752 |
| 7,819,004 B2* | 10/2010 | Steele et al. | 73/493 |
| 7,901,834 B2* | 3/2011 | Adams et al. | 429/515 |
| 7,954,476 B2* | 6/2011 | Murakoshi et al. | 123/509 |
| 8,100,092 B2* | 1/2012 | McBride et al. | 123/3 |
| 8,520,397 B2* | 8/2013 | Azumi et al. | 361/752 |
| 8,635,985 B2* | 1/2014 | McAlister | 123/297 |
| 8,747,155 B2* | 6/2014 | Weber et al. | 439/589 |
| 8,851,923 B2* | 10/2014 | Klaassen et al. | 439/587 |
| 8,851,924 B2* | 10/2014 | Fleischmann et al. | 439/587 |
| 8,851,937 B2* | 10/2014 | Kawai et al. | 439/754 |
| 2007/0077828 A1* | 4/2007 | Kurahashi | 439/936 |

* cited by examiner

Housing Cover and RTV Interface

FIG. 8

FIG. 10
After Hot air Heat Stack

Housing posts to Cover Interface - 14 Places

Housing posts for cover 14 Places

FIG. 12

Housing post to Cover line to line contact

14 Places 1.0mm 3.0 X 1.0mm

PCB and housing Crush rib interface

FIG. 13

FIG. 13B
Section B-B
4 places

FIG. 13A
Section A-A
2 places

**Compression Limiter and Housing Interface
2 catches for single attachment**

ELECTRICAL CONNECTOR WITH SEALED PINS

CROSS REFERENCE TO RELATED APPLICATION

The present application claims the filing benefit of U.S. provisional application, Ser. No. 61/659,741, filed Jun. 14, 2012, which is hereby incorporated herein by reference in its entirety.

FIELD OF THE INVENTION

The present invention relates to electrical connectors for electrically connecting electrical components to a connector of a vehicle wiring harness or the like.

BACKGROUND OF THE INVENTION

Multi-pin electrical connectors, such as multi-pin plug and socket connectors are known. When such electrical connectors are used in harsh environments, such as on a vehicle and such as at an exterior portion of a vehicle or in the engine compartment of a vehicle or the like, the terminals are typically sealed to limit water intrusion into the connectors.

SUMMARY OF THE INVENTION

The present invention provides an electrical connector, such as for a fuel controller or the like of a vehicle, that has multiple pins or terminals that are sealed by providing or dispensing a sealing material at the terminal location from outside of the electrical connector and after the electrical connector and controller is fully assembled. The sealing material or sealant or sealing means of the present invention seals against the likes of moisture ingress and contaminant ingress or the like at the fuel controller (or other electrically powered or controlled device or unit). For example, the sealing material may seal the device or unit to protect the internal components and circuitry of the device or unit against the outside environment.

The present invention thus facilitates applying the sealant from the outside of the connector cavity instead of a more conventional internal cavity. Thus, the present invention allows the pins to be sealed after the electronic control unit (ECU) is fully assembled. A further benefit of the present invention is that an operator or machine assembling the ECU does not touch or contact the terminals at any time during the sealing process. A further benefit of the present invention is that the part will not have sealant spillover that could impact the otherwise successful ECU assembly. Aspects of the present invention may apply to various different types of sealants, such as, for example, ultraviolet (UV) cure resins, moisture cure resins, epoxies, heat activated sealants or materials and/or the like.

These and other objects, advantages, purposes and features of the present invention will become apparent upon review of the following specification in conjunction with the drawings.

DESCRIPTION OF THE PREFERRED EMBODIMENTS

Figures 1, 2:
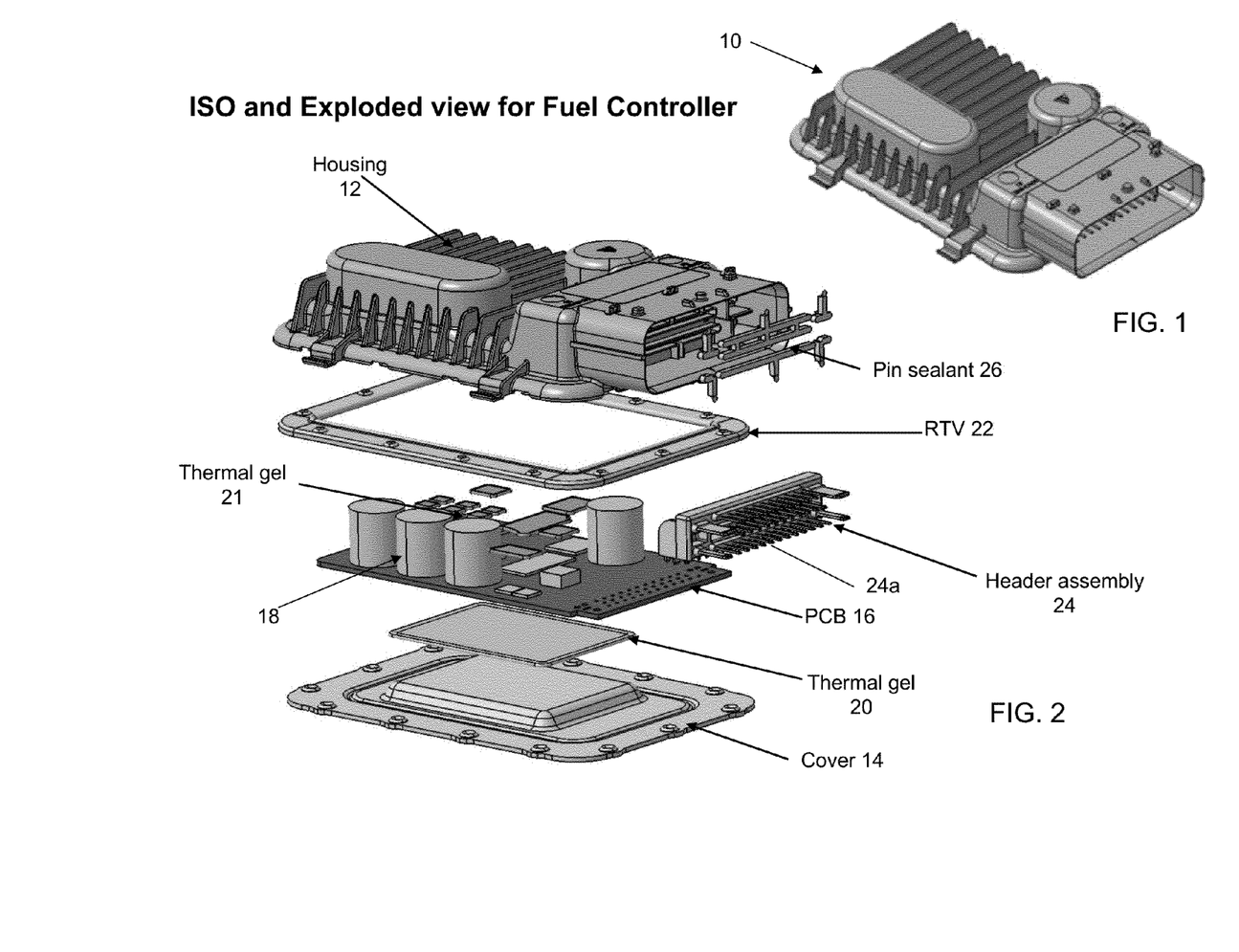
FIG. 1 is a perspective view of a fuel controller having a sealed terminal connector in accordance with the present invention.
FIG. 2 is an exploded perspective view of the fuel controller of FIG. 1.
Figures 3, 4:
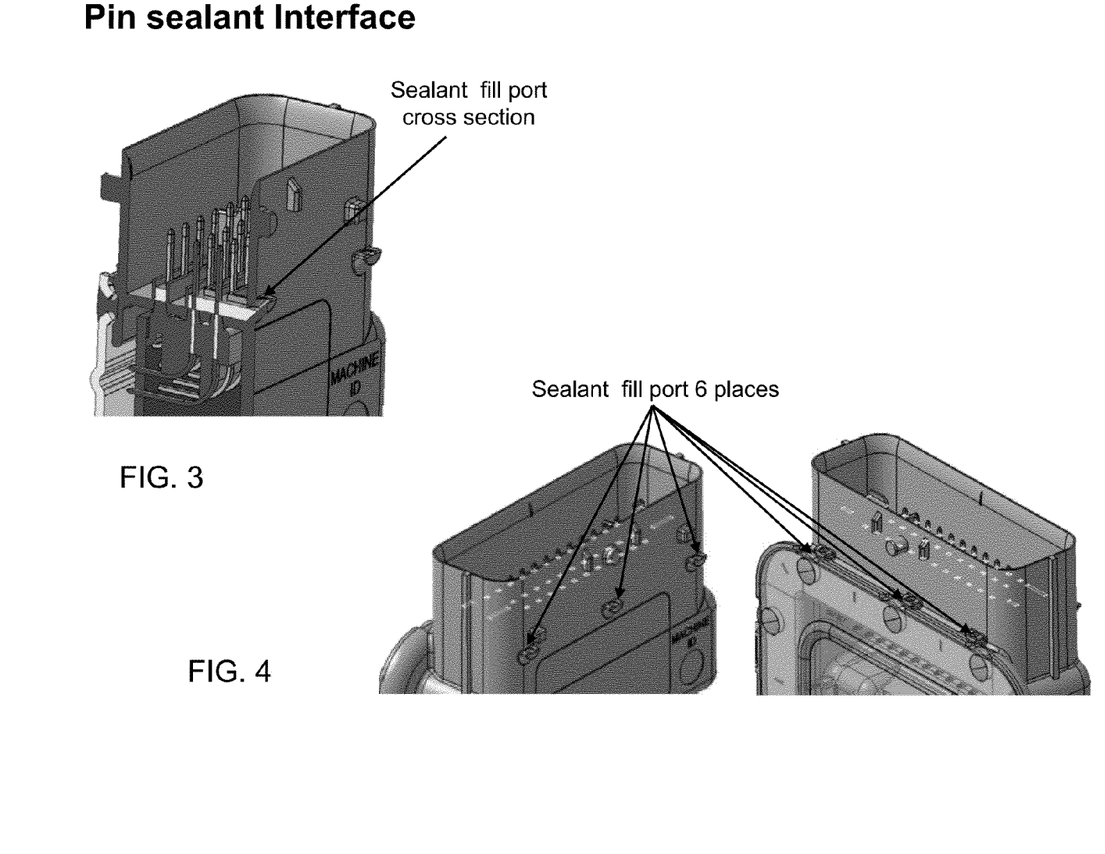
FIG. 3 is a perspective and partial sectional view of the fuel controller of FIG. 2, showing the sealant at the terminals of the connector.
FIG. 4 is a perspective view of opposite sides of the connector portion of the fuel controller, showing the fill ports for filling the sealant into the connector.

Referring now to the drawings and the illustrative embodiments depicted therein, a fuel controller 10 comprises a housing 12 and a cover 14, which contain or house a printed circuit board or PCB 16 and associated circuitry 18 therein. Thermal gel 20 is disposed between the PCB 16 and the cover 14 and thermal gel 21 is disposed at the circuitry 18, and an RTV or seal 22 is disposed between the cover 14 and the housing 12 to seal the cover relative to the housing when the fuel controller is assembled. A header assembly or terminal or connector 24 is electrically connected at the PCB 16 and is configured so that a plurality of terminals or pins 24a protrude into a connector portion 12a of housing 12 when the fuel controller is assembled. A pin sealant 26 is disposed at the terminals or pins 24a to substantially seal the terminals at the connector portion 12a to limit water and/or dirt and/or contaminant intrusion into the fuel controller or device or unit, as discussed below. Preferably, the sealant at least partially seals the device or unit, more preferably the sealant at least substantially seals the device or unit and more preferably the sealant hermetically seals the device or unit.

Figures 5, 6, 7:
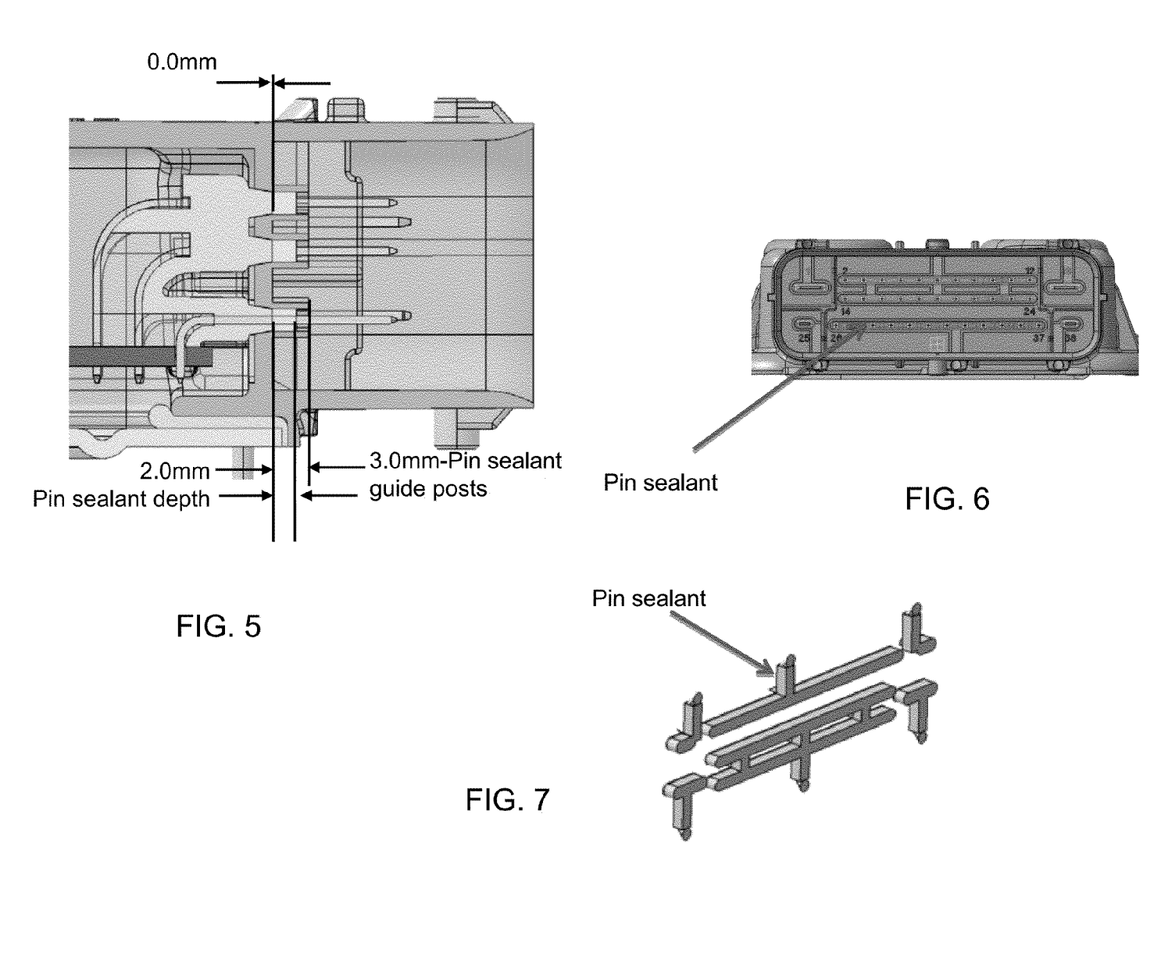
FIG. 5 is a sectional view of the connector portion of the fuel controller of FIG. 1.
FIG. 6 is an end view of the connector portion of the fuel controller of FIG. 1.
FIG. 7 is a perspective view of the pin sealant as it is formed when injected or dispensed at the connector portion of the fuel controller.
Figure 8:
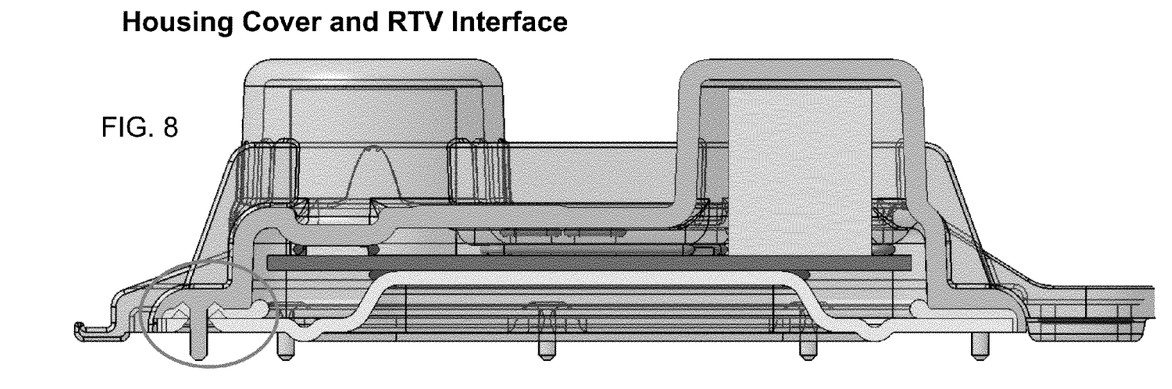
FIG. 8 is a sectional view of the fuel controller of FIG. 1.
Figure 9:
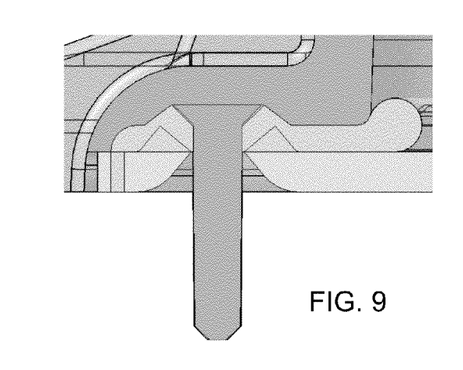
FIG. 9 is an enlarged view of the housing heat stake post and cover heat stake hole interface.
Figure 10:
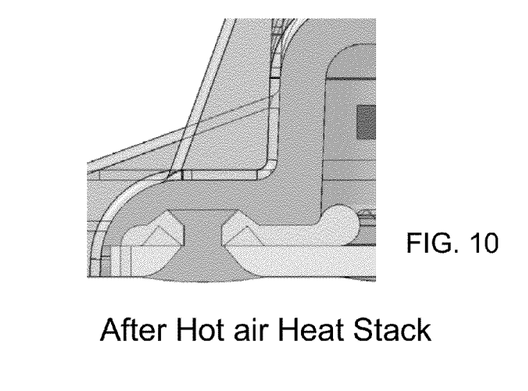
FIG. 10 is another enlarged view similar to FIG. 9, showing the interface after hot air heat stake.
Figure 11:
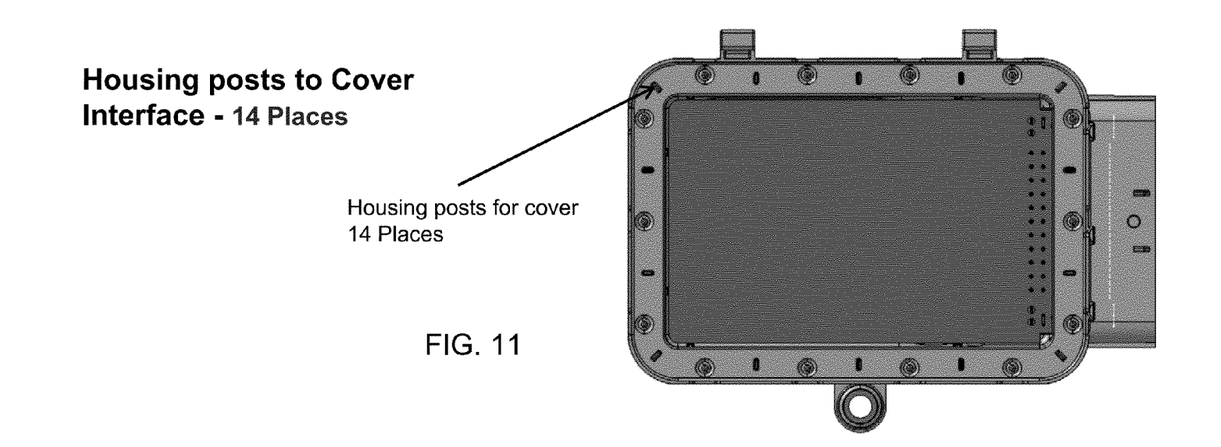
FIG. 11 is a plan view of the fuel controller of FIG. 1, showing multiple housing posts for attaching the cover to the housing.
Figure 12:
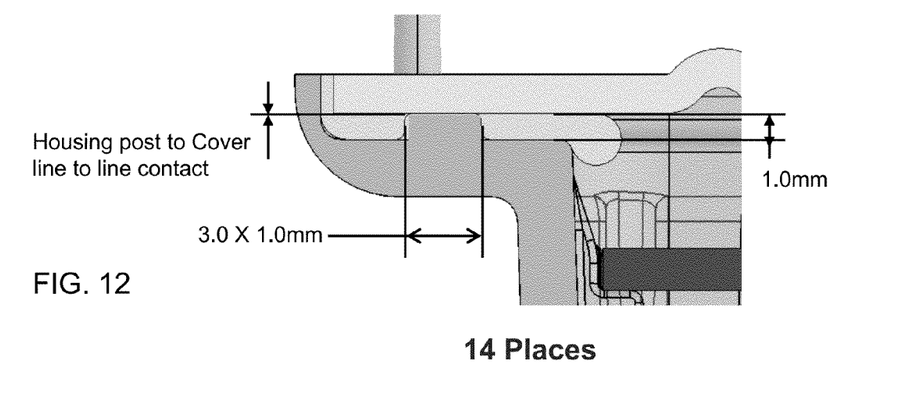
FIG. 12 is an enlarged sectional view of the fuel controller, showing a housing post for attaching the cover to the housing.
Figure 13:
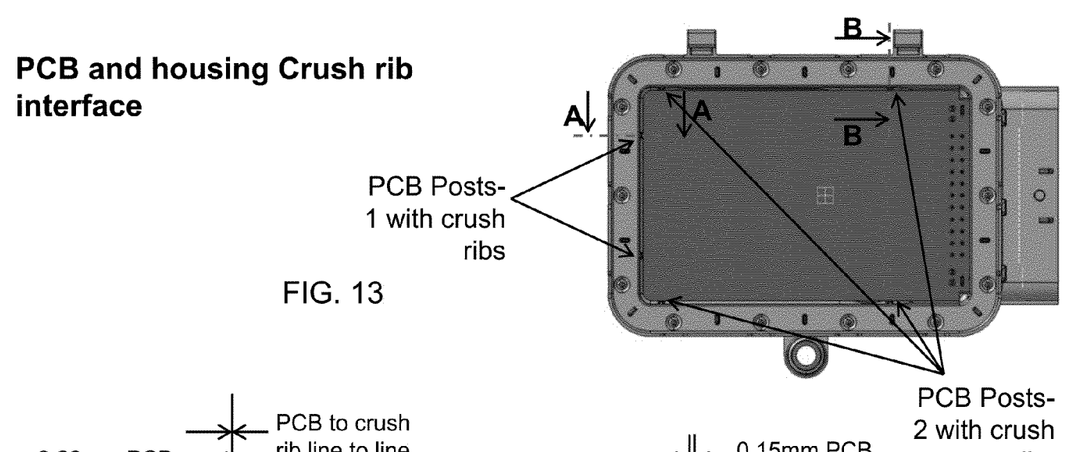
FIG. 13 is another plan view of the fuel controller of FIG. 1.
Figure 13A:
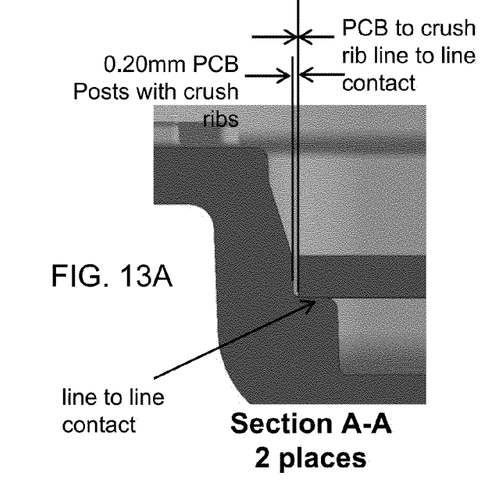
FIG. 13A is a sectional view taken along the line A-A, showing the PCB and housing crush rib interface.
Figure 13B:
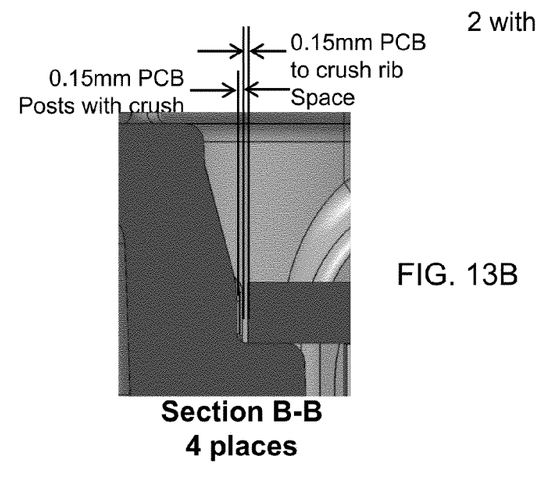
FIG. 13B is a sectional view taken along the line B-B, showing the PCB and housing crush rib interface.
Figures 14, 15:
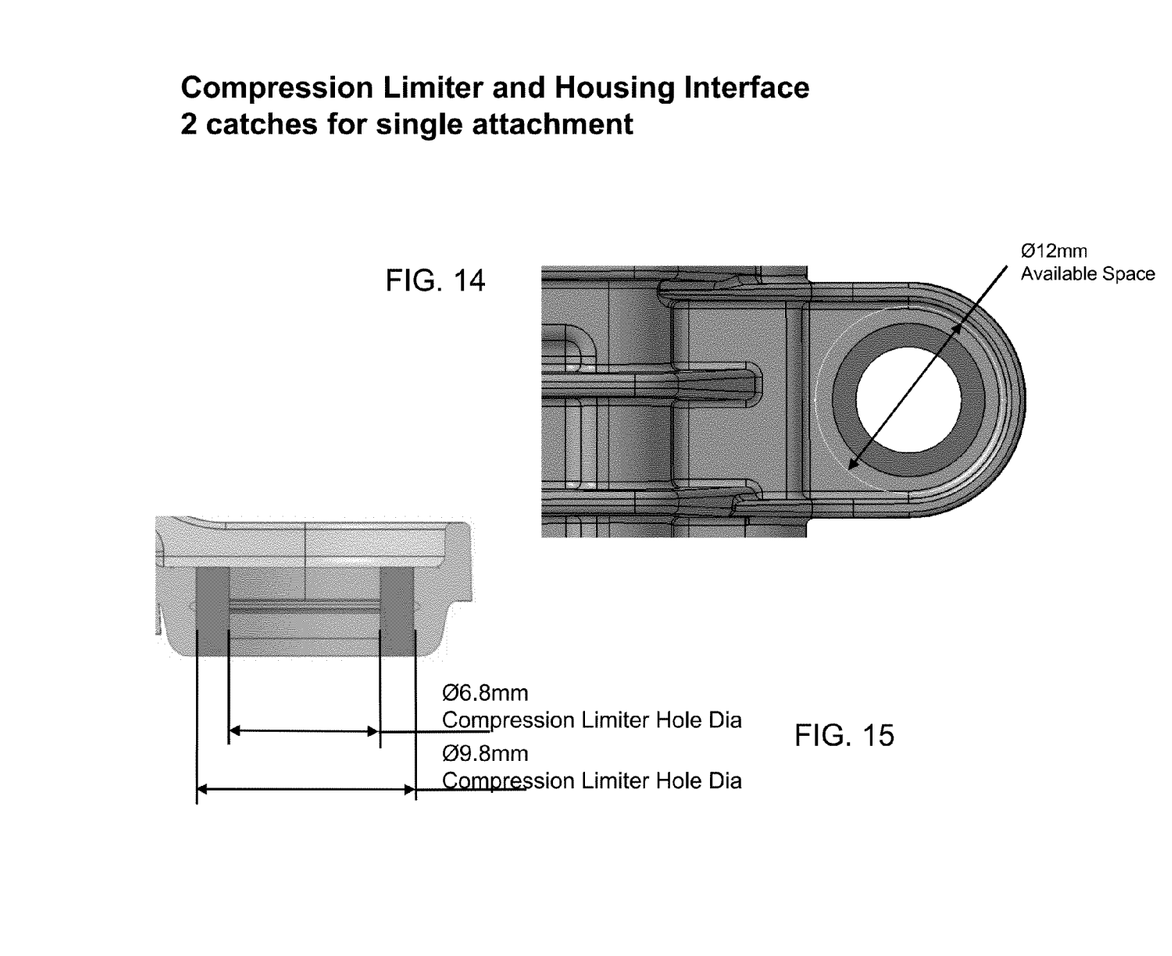
FIG. 14 is a plan view of an attachment portion of the fuel controller, showing the compression limiter and housing interface.
FIG. 15 is a sectional view of the attachment portion of FIG. 14.

As best shown in FIGS. 3-7, the connector portion 12a of housing includes a plurality of fill ports or sealant ports, through which the pin sealant material is dispensed or injected to fill and seal the area at and around the terminals 24a. As best shown in FIG. 6, the connector portion 12a includes channels that are connected to or formed to correspond with respective ones of the sealant fill ports, such that when sealant is injected into a respective port, the sealant material flows along the respective channel to fill in the channel and surround and seal at the terminals or pins disposed along that channel.

Thus, the present invention provides a method that applies the sealant from the outside of the connector cavity instead of a more conventional internal cavity. At least one benefit of this approach is that the pins can be sealed after the controller or ECU is fully assembled. A further benefit is that the terminals may not be touched at any time during the sealing process (since they are within the cavity of the connector portion of the housing). A further benefit of the present invention is that the present invention, by dispensing the sealant at and around the terminals via flowing of the sealant along channels may avoid sealant spillover that could impact an otherwise successful ECU assembly.

The sealant may comprise any suitable sealant material. For example, the sealant may comprise a UV cure resin, a moisture cure resin, an epoxy, a heat activated sealant or material, a silicone sealant, a room temperature vulcanizing (RTV) silicone, an acrylic sealant, an aerobically activated sealant, an anaerobically activated sealant and/or the like. Although shown and described as being implemented at a fuel controller, it is envisioned that the sealant system of the present invention may be applicable to a wide range of electronic components, such as other vehicular electronic components, such as electronic components or accessories that are disposed at a harsh environment when normally installed at a vehicle.

Figure 16:
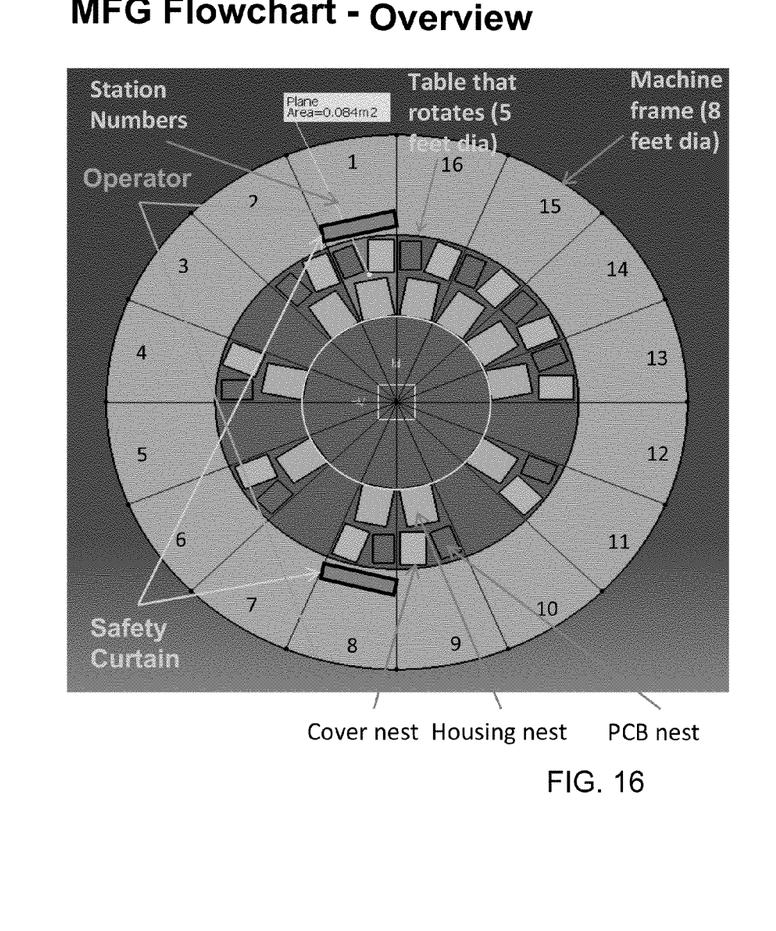
FIG. 16 is an assembly system for assembling the fuel controller of FIG. 1.

Optionally, and with reference to FIG. 16, the manufacturing of the controller may be performed at a plurality of stations (such as stations arranged, for example, in a circle). An inner table (such as a table having an outer diameter of, for example, about five feet or thereabouts) may include a plurality of movable stations or areas (with each area having a cover nest, a housing next and a PCB nest established thereat), which are rotatable to move the components and/or partially assembled assembly from one station to the next (with the outer stations arranged around the table and having an outer diameter of, for example, about eight feet or thereabouts). As shown in FIG. 16, the controller or ECU may be assembled by an operator at a first station (Station 1, which may have a safety curtain to protect the operator) unloading/unpacking an assembly, loading a housing and a cover and scanning in RTV, pin seal, thermal gel, housing and cover for a particular controller. At Station 2, the housing and the cover are plasma etched. At Station 4, the thermal gel is applied at the housing and the thermal gel is applied at the cover. At Station 6, the RTV is applied to the housing, and at Station 8 (which may have a safety curtain to protect the operator), an operator adds the PCB assembly (already confirmed passed ICT) to the housing, and adds the cover (already plasma etched and with the thermal gel applied thereat), and loads the PCB assembly (unconfirmed ICT). At Station 9, the assembly is heat staked (such as with hot air) to seal and secure the cover at the housing (see FIGS. 8-12). At Station 11, the thermal gel is added and the PCB assembly is confirmed to pass ICT. At Station 13, the pin sealant is added, and the pin sealant is UV cured at Station 14 to seal the terminals at the connector portion of the housing. At Station 16, a terminal camera may perform an inspection of the assembled ECU and the assembled ECU may be laser identified or demarcated, such as by laser scribing or the like. The nest or nests at each station on the rotating table may then be rotated or indexed to the home position to repeat the process.

Therefore, the present invention provides a sealant at the terminals of an electrical connector portion of an electrical component or accessory, whereby the sealant may be provided or dispensed or injected at the terminals after the accessory is fully assembled and from outside of the connector cavity. The sealant may be dispensed at the terminals to seal the terminals at the connector portion without any contact by an operator at the terminals during the sealant process. Thus, the present invention provides an enhanced assembly process that provides enhanced sealing of the terminals at a connector portion of an electronic accessory, to limit or substantially preclude water intrusion into the accessory housing when the accessory is disposed at or installed or exposed to a harsh environment, such as is often encountered in a vehicle application. Although shown and described as part of a vehicular fuel controller, the sealing means of the present invention may be suitable for and applied to other applications or devices, such as, for example, a camera assembly of a vehicle, an actuator assembly of a vehicle (such as a mirror actuator or the like), or any other assembly/module of a vehicle or the like.

Changes and modifications to the specifically described embodiments may be carried out without departing from the principles of the present invention, which is intended to be limited only by the scope of the appended claims as interpreted according to the principles of patent law.

The invention claimed is:

1. An electrical accessory for a vehicle, said electrical accessory comprising:
   a housing having a connector portion having a connector cavity therein;
   a plurality of terminals that electrically connect at a circuit element in said housing and that protrude at least partially into said connector cavity;
   wherein said housing comprises at least one fill port and at least one channel for receiving a sealant material through said fill port, whereby said sealant material is dispensed at said at least one fill port and flows along said at least one channel and at and around individual terminals of said plurality of terminals to substantially seal said individual terminals relative to one another and relative to said housing; and
   wherein said fill port is accessible from outside of said housing after said electrical accessory is assembled.

2. The electrical accessory of claim 1, wherein said at least one fill port and said at least one channel comprise a plurality of fill ports and a plurality of channels, with said fill ports associated with respective channels.

3. The electrical accessory of claim 2, wherein said sealant is dispensed through each of said fill ports to substantially seal respective terminals at respective channels.

4. The electrical accessory of claim 1, wherein said sealant is injected into said at least one fill port.

5. The electrical accessory of claim 1, wherein said sealant is dispensed at said at least one fill port when in uncured state, and wherein said sealant is cured after it is dispensed to a cured state of substantially seal said at least one terminal relative to said housing.

6. The electrical accessory of claim 5, wherein said sealant is UV cured to said cured state.

7. The electrical accessory of claim 1, wherein said electrical accessory comprises a fuel controller of a vehicle.

8. The electrical accessory of claim 1, wherein said connector portion comprises a plug or socket connector portion and wherein said plurality of terminals comprises pins of a multi-pin connector of said plug or socket connector portion.

9. A method of manufacturing an electrical accessory, said method comprising:

providing a housing having a connector portion having a connector cavity therein, wherein said housing comprises at least one fill port and at least one sealant channel;

assembling a circuit element and a cover at said housing so that said circuit element is substantially housed by said housing and said cover;

providing a plurality of terminals and electrically connecting said terminals at said circuit element in said housing, whereby said terminals protrude at least partially into said connector cavity;

accessing said at least one fill port from outside said housing after said circuit element and said cover are assembled at said housing and after said terminals are electrically connected at said circuit element; and dispensing a sealant material through said at least one fill port so said sealant material flows along said at least one channel and at and around individual terminals of said plurality of terminals to substantially seal said individual terminals relative to one another and relative to said housing.

10. The method of claim 9, wherein said at least one fill port and said at least one channel comprise a plurality of fill ports and a plurality of channels, with said fill ports associated with respective channels.

11. The method of claim 10, wherein dispensing a sealant comprises dispensing a sealant through each of said fill ports to substantially seal respective terminals at respective channels.

12. The method of claim 9, wherein dispensing a sealant material comprises dispensing a sealant material in an uncured state, and wherein said method includes curing said sealant material to a cured state after said sealant material is dispensed to substantially seal said at least one terminal relative to said housing.

13. The method of claim 12, wherein curing said sealant material comprises curing said sealant material via a UV curing process.

14. The method of claim 9, wherein said connector portion comprises a plug or socket connector portion and wherein said plurality of terminals comprises pins of a multi-pin connector of said plug or socket connector portion.

15. An electrical accessory for a vehicle, said electrical accessory comprising:

a housing having a connector portion having a connector cavity therein;

a plurality of terminals that electrically connect at a circuit element in said housing and that protrude at least partially into said connector cavity;

wherein said connector portion comprises a plug or socket connector portion and wherein said plurality of terminals comprises pins of a multi-pin connector of said plug or socket connector portion;

wherein said housing comprises at least one fill port and at least one channel for receiving a sealant material through said fill port, whereby said sealant material, when in its uncured state, is injected into said at least one fill port and flows along said at least one channel and at and around individual pins of said plurality of terminals, and wherein said sealant material is cured to a cured state to substantially seal said individual pins relative to one another and relative to said housing; and wherein said fill port is accessible from outside of said housing after said electrical accessory is assembled.

16. The electrical accessory of claim 15, wherein said at least one fill port and said at least one channel comprise a plurality of fill ports and a plurality of channels, with said fill ports associated with respective channels.

17. The electrical accessory of claim 16, wherein said sealant is dispensed through each of said fill ports to substantially seal respective terminals at respective channels.

18. The electrical accessory of claim 17, wherein said channels correspond with respective ones of the sealant fill ports, such that, when said sealant material is injected into a respective port, the sealant material flows along the respective channel to fill in the channel and surround and seal at the terminals disposed along that channel.

19. The electrical accessory of claim 15, wherein said sealant is UV cured to said cured state.

20. The electrical accessory of claim 15, wherein said electrical accessory comprises a fuel controller of a vehicle.

* * * * *

UNITED STATES PATENT AND TRADEMARK OFFICE
CERTIFICATE OF CORRECTION

PATENT NO.        : 9,077,098 B2
APPLICATION NO.   : 13/916051
DATED             : July 7, 2015
INVENTOR(S)       : Paul D. Latunski

Page 1 of 1

It is certified that error appears in the above-identified patent and that said Letters Patent is hereby corrected as shown below:

In the Claims:

Column 4
Line 54, Claim 5, Insert --an-- after "in"
Line 56, Claim 5, "of" should be --to--

Signed and Sealed this
Fifth Day of July, 2016

Michelle K. Lee
*Director of the United States Patent and Trademark Office*